United States Patent [19]
Lane

[11] Patent Number: 6,157,212
[45] Date of Patent: *Dec. 5, 2000

[54] PROGRAMMABLE LOGIC DEVICE WITH EXPANDABLE-WIDTH MEMORY REGIONS

[75] Inventor: Christopher F. Lane, Campbell, Calif.

[73] Assignee: Altera Corporation, San Jose, Calif.

[*] Notice: This patent is subject to a terminal disclaimer.

[21] Appl. No.: 09/418,187

[22] Filed: Oct. 12, 1999

Related U.S. Application Data

[63] Continuation of application No. 08/958,772, Oct. 27, 1997.
[60] Provisional application No. 60/050,890, Jun. 26, 1997.

[51] Int. Cl.[7] .................................................. G06F 7/38
[52] U.S. Cl. ............................. 326/40; 326/39; 326/41
[58] Field of Search .................................. 326/38, 39, 41

[56] References Cited

U.S. PATENT DOCUMENTS 5,689,195  11/1997  Cliff et al. .
5,744,980  4/1998  McGowan et al. .

OTHER PUBLICATIONS

"1996 Data Book," (pp. 29–90) Altera Corporation (1996).
"The Programmable Logic Data Book," Xilinx, Inc. (1996).

*Primary Examiner*—Michael Tokar
*Assistant Examiner*—Anh Tran
*Attorney, Agent, or Firm*—Fish & Neave; Robert R. Jackson; G. Victor Treyz

[57] ABSTRACT

Circuitry is provided that allows programmable memory regions to use the data input and output resources of nearby programmable logic regions. The regular width of the data input port of a programmable memory region can be effectively increased by selectively connecting the data inputs of one or more of the programmable logic regions to the memory region. Similarly, the regular width of the data output port of the programmable memory region can be effectively increased by selectively connecting the programmable memory region to the data outputs of one or more of the programmable logic regions.

22 Claims, 9 Drawing Sheets

PROGRAMMABLE LOGIC DEVICE WITH EXPANDABLE-WIDTH MEMORY REGIONS

This application is a continuation of U.S. application Ser. No. 08/958,772, filed Oct. 27, 1997, which claims the benefit of U.S. Provisional Application Ser. No. 60/050,890, filed Jun. 26, 1997.

BACKGROUND OF THE INVENTION

This invention relates to programmable logic devices, and more particularly, to programmable logic devices containing programmable memory regions.

Programmable logic devices are integrated circuits that may be configured by a user to perform custom logic functions. At their most basic level, programmable logic devices are based on programmable switches or connectors. Such programmable components may be based on random-access memory, read-only memory, erasable programmable read-only memory, electrically-erasable programmable read-only memory, fuses, antifuses, ferro-electric elements, or other suitable programmable component technology.

Programmable components are typically organized as groups or regions of logic. A typical programmable logic device contains many such logic regions. In some programmable logic devices, such as the FLEX 10K programmable logic devices of Altera Corporation, these programmable logic regions are referred to as "logic array blocks." Programmable logic regions may also be referred to as "complex logic blocks." This terminology is used by Xilinx, Inc. in referring to the logic regions in their XC4000 family of programmable logic devices, as described in the 1996 Xilinx Data Book (entitled "The Programmable Logic Data Book"), which is hereby incorporated by reference herein in its entirety.

Programmable logic regions are typically arranged on a programmable logic device in a regular pattern. For example, programmable logic regions may be arranged in rows and columns. Vertical interconnections in each column are used to convey signals between the logic regions in that column. Horizontal interconnections in each row are used to convey signals between the logic regions in that row. Additional circuitry is provided to convey signals between the horizontal and vertical interconnections and to convey signals between the logic regions and the interconnections.

Logic regions may contain look-up table logic or product term logic, register logic, and other logic circuitry that allows users to create medium-sized blocks of logic such as counters, address decoders, and state machines. Multiple logic regions may be combined to create larger logic blocks. Special interconnections between adjacent logic regions facilitate the implementation of logic circuits built from chains of neighboring logic regions such as adders and multipliers.

Another type of resource available on programmable logic devices such as the FLEX 10K programmable logic device of Altera Corporation is programmable memory. Programmable memory regions are similar to programmable logic regions in that they can be configured by a user to perform various functions. Programmable memory regions may be used to perform the functions of random-access memory, read-only memory, first-in-first-out memory, and dual-port memory. Programmable memory regions may also be used to implement complex logic functions for applications such as multipliers, microcontrollers, state machines, and digital signal processors.

If desired, programmable memory regions can be programmed with a read-only pattern to create a large look-up table. This arrangement allows programmable memory regions to perform certain combinatorial functions quickly by looking up results in the look-up table, rather than by computing results using programmable logic regions.

However, the number of input and output lines to the programmable memory regions is limited. For example, the data ports of the memory regions in the FLEX 10K programmable logic devices of Altera Corporation can support data signals up to eight bits wide. If a user desires to handle signals with data widths larger than eight bits, such a device cannot be used without combining multiple programmable memory regions in parallel, which requires that address signals be routed to each of the multiple programmable memory regions that are combined. Moreover, the maximum data width that can be supported is limited to eight bits times the total number of programmable memory regions on the device.

Although the data port size of a standard programmabe memory region on a programmable logic device could be scaled up to handle larger data widths, doing so would be costly. For example, scaling up a standard eight-bit programmable memory region to handle 32 bit data would require the addition of 24 input lines and 24 output lines to the data ports. As a result, many resources would be allocated to providing the larger data ports, even though many users might not require such large data ports.

It is therefore an object of the present invention to provide a programmable logic device in which a user can effectively increase the size of the data ports of a programmable memory region using input and output resources from nearby programmable logic regions.

SUMMARY OF THE INVENTION

This and other objects of the invention are accomplished in accordance with the principles of the present invention by providing circuitry that allows programmable memory regions to use the data input and output resources of nearby programmable logic regions to increase the effective width of the programmable memory region data ports. The regular width of the data input port of a programmable memory region can be effectively increased by selectively connecting the inputs of one or more programmable logic regions to the memory region using supplemental data input lines. Similarly, the regular width of the data output port of the programmable memory region can be effectively increased by selectively connecting the programmable memory region to the data outputs of one or more programmable logic regions using supplemental data output lines.

As a result, a programmable memory region with eight-bit data ports can use input and output resources from nearby programmable logic regions to increase the effective width of the data ports to accommodate a larger data width. For example, such resources may be used to increase the effective width of the data ports to accommodate data widths of 32 bits. If programmable logic regions are used that handle 24 bit data, the increase in the effective width of the data ports from eight bits to 32 bits can be accomplished using a single additional programmable logic region for inputs and a single additional programmable logic region for outputs. If programmable logic regions are used that handle eight-bit data, the increase in the effective width of the data ports from eight bits to 32 bits may use three additional programmable logic regions for inputs and three additional programmable logic regions for outputs.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
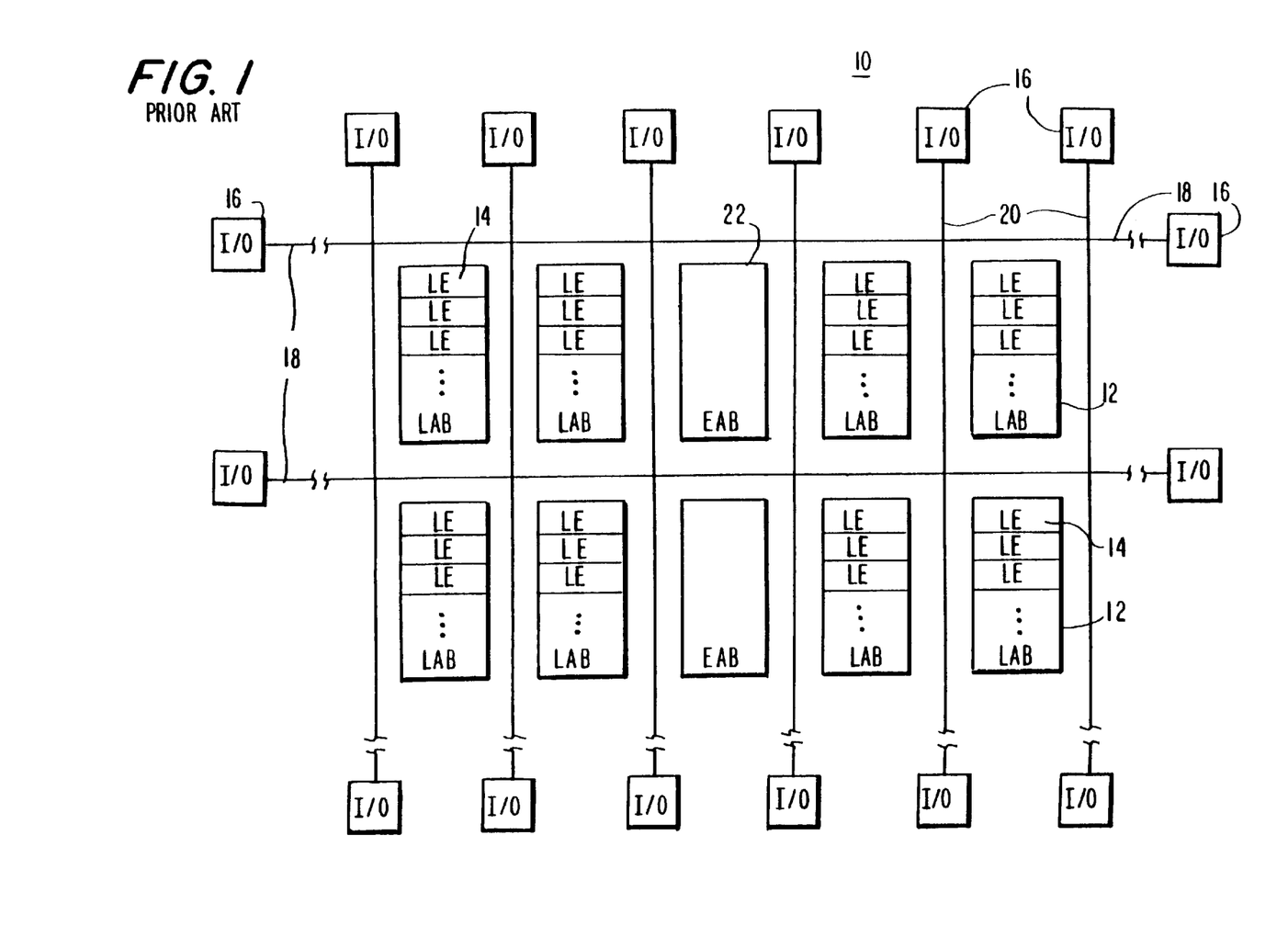
FIG. 1 is a schematic circuit diagram of a conventional programmable logic device containing logic array blocks and embedded memory blocks.

A typical programmable logic device 10 of the type in the FLEX 10K family of programmable logic devices of Altera Corporation is shown in FIG. 1. Programmable logic device 10 has rows and columns of logic regions called logic array blocks. Each logic array block 12 contains eight logic elements 14. Logic elements 14 are based on look-up table logic and contain register logic and other logic circuitry to provide various programmable logic functions.

Logic array blocks 12 are arranged in rows and columns and are interconnected to each other and to input/output pads 16 by horizontal interconnections 18 and by vertical interconnections 20. There are numerous input/output pads 16 in each row and column. In addition, there are numerous vertical conductors in each column of vertical interconnections 20 and numerous horizontal conductors in each row of horizontal interconnections 18.

The center column of programmable logic device 10 contains programmable memory regions called embedded array blocks. Embedded array blocks 22 have input and output data ports that can handle data signals up to eight bits wide.

There are programmable connections between logic array blocks 12 and interconnections 18 and 20, between embedded array blocks 22 and interconnections 18 and 20, and between horizontal interconnections 18 and vertical interconnections 20 that are not shown in FIG. 1 to avoid over-complicating the drawing.

Figure 2:
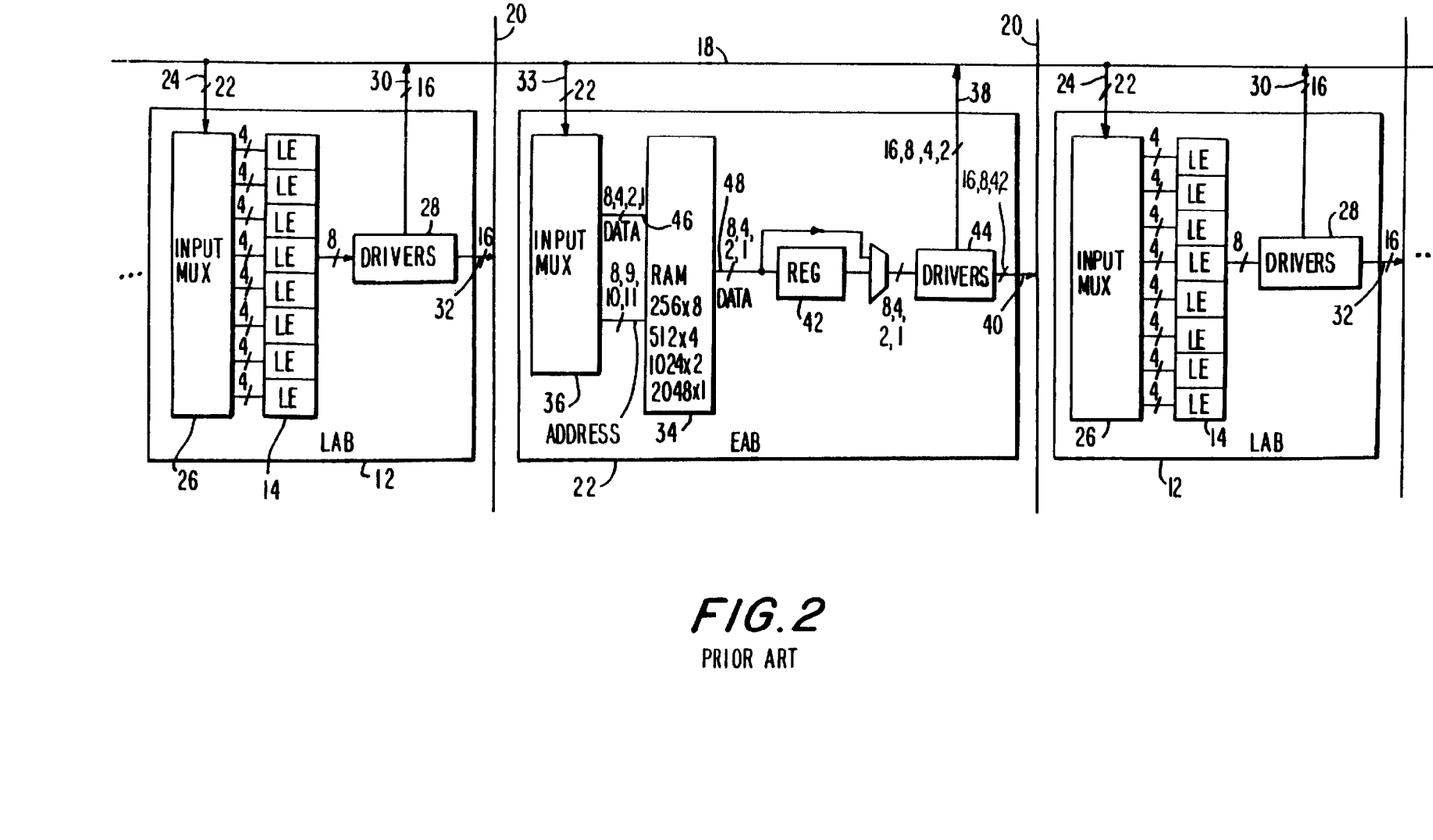
FIG. 2 is a more detailed schematic circuit diagram of a portion of the conventional programmable logic device of FIG. 1.

Some of these programmable connections are shown in FIG. 2. For example, FIG. 2 shows how input lines 24 from horizontal interconnections 18 are programmably connected to logic elements 14 by input multiplexer 26. Output signals from logic elements 14 are routed to horizontal interconnections 18 and vertical interconnections 20 by programmable drivers 28 and output lines 30 and 32. In embedded array block 22, input lines 33 from horizontal interconnections 18 are programmably connected to variable depth and width random-access memory 34 by input multiplexer 36. Data from random-access memory 34 is provided to output lines 38 and 40 by by passable registers 42 and programmable drivers 44.

Some of the signal paths in FIG. 2 have more than eight lines. For example, there are 22 input lines 24 associated with each logic array block 12. In addition, each logic array block has 16 possible output lines 32 for routing signals to vertical interconnections 20 and 16 possible output lines 30 for routing signals to horizontal interconnections 18. However, the data path through each logic array block 12 is effectively limited to an eight-bit width by the number of logic elements 14 in each block. The additional input lines 24 and the additional output lines 30 and 32 are used to provide alternative pathways during device programming, thereby increasing the flexibility of the device when implementing a given logic design.

Similarly, even though there are 22 possible input lines 33, 16 possible output lines 38, and 16 possible output lines 40 in embedded array block 22, the effective data path width of embedded array block 22 is limited to eight bits by the eight-bit maximum size of input data port 46 and output data port 48.

Although the maximum data width that can be handled by random-access memory 34 is eight bits, random-access memory 34 may be placed in various depth and width configurations by the user. For example, in addition to configuring random-access memory 34 as a 256×8 array to handle eight-bit data (using an eight bit address signal), random-access memory 34 may be configured as a 512×4 array to handle four-bit data (using a nine-bit address signal), as a 1024×2 array to handle two-bit data (using a ten-bit address signal), or as a 2048×1 array to handle one-bit data (using an eleven-bit address signal).

Figure 3:
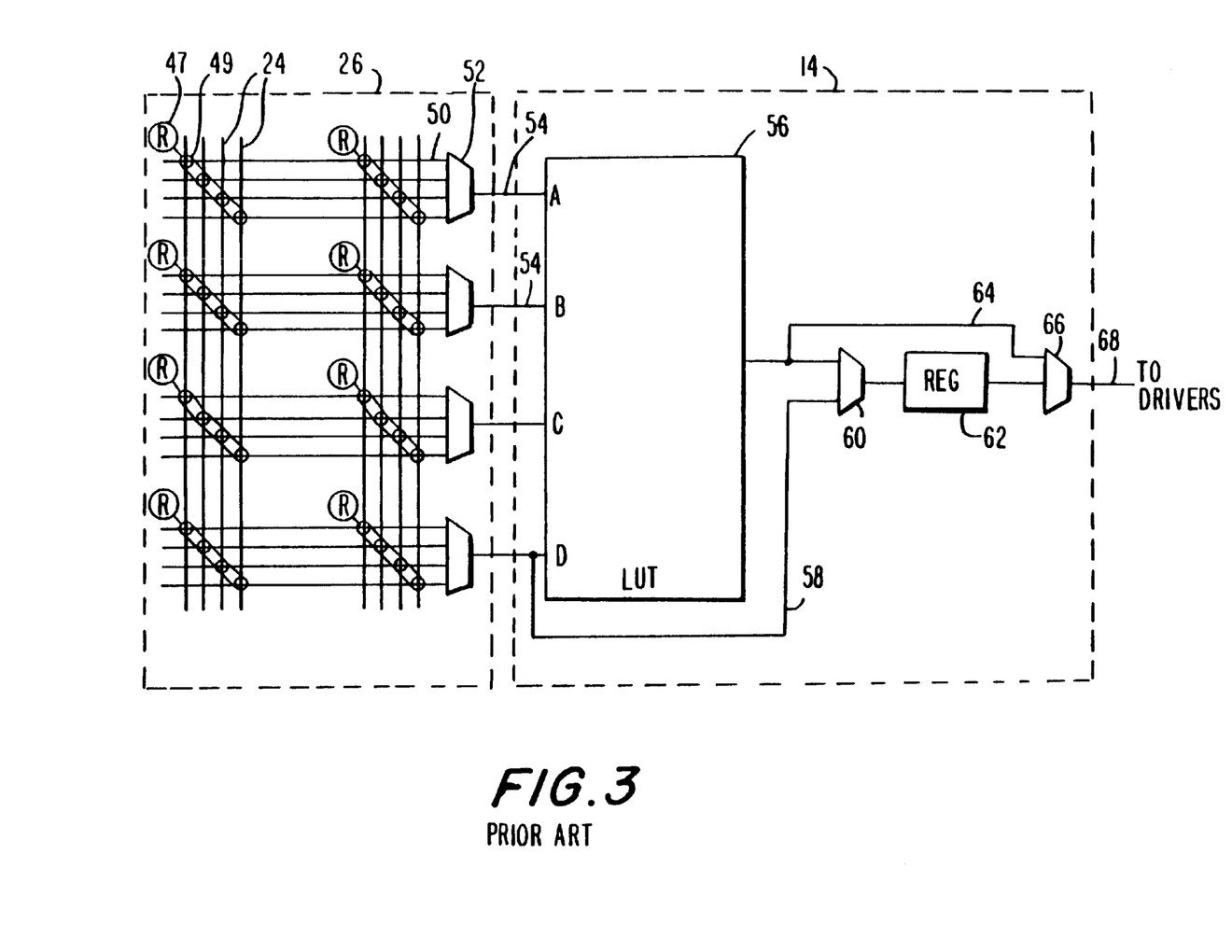
FIG. 3 is a schematic circuit diagram of a conventional logic element and a portion of an associated input multiplexer contained within one of the logic array blocks of FIGS. 1 and 2.

A typical logic element 14 and a portion of input multiplexer 26 are shown in FIG. 3. When a programmable cell 47 is programmed, each of the four connections in the associated switch 49 are closed, which connects four of inputs 24 to four associated lines 50. A corresponding programmable 4:1 multiplexer 52 in that row of four lines 50 connects a selected one of the four lines 50 to a corresponding line 54. Four lines 54 are connected to respective inputs of look-up table 56. The D input of look-up table 56 has an associated bypass conductor 58 and multiplexer 60, so that signals to logic element 14 that do not need to be passed through look-up table 56 can avoid incurring the delay associated with the operation of look-up table 56.

Register 62 is provided for registering output signals from multiplexer 60. Register 62 can be bypassed using bypass line 64 and multiplexer 66. Signals from logic element output 68 are provided to drivers 28 (FIG. 2).

Figure 4:
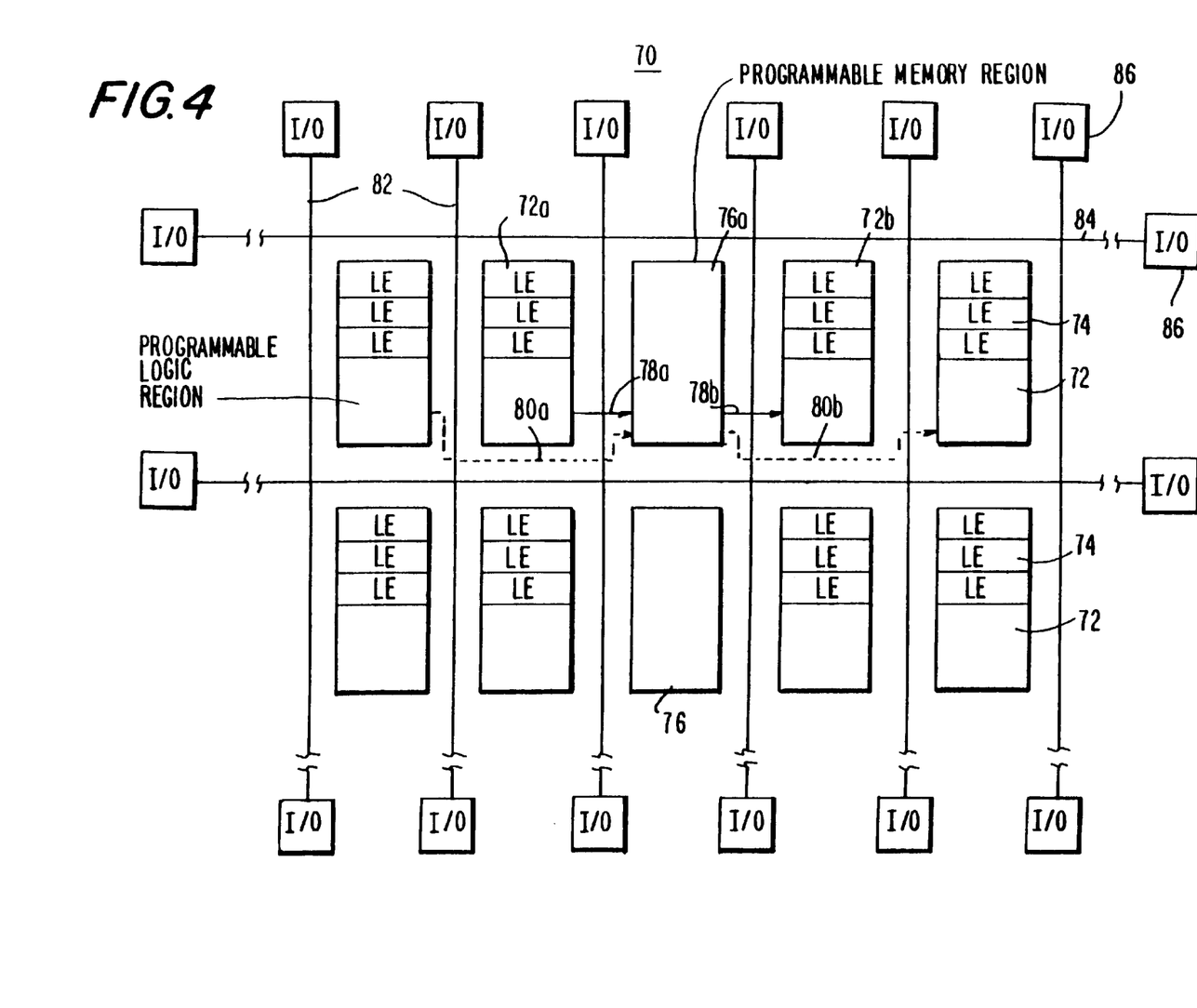
FIG. 4 is a schematic circuit diagram of an illustrative programmable logic device in accordance with the present invention.

An illustrative programmable logic device constructed in accordance with the present invention is shown in FIG. 4. Programmable logic device 70 has programmable logic regions 72, which are preferably arranged in rows and columns. Each programmable logic region 72 contains programmable logic circuitry that is preferably arranged in the form of multiple logic elements 74, although other suitable programmable logic circuit arrangements may be used if desired.

Programmable logic regions 72 may contain look-up table logic or product term logic, register logic, and other logic circuitry that allows users to create medium-sized logic circuits such as counters, address decoders, and state machines. Multiple programmable logic regions 72 may be combined to implement larger logic designs. Local interconnections between adjacent logic regions 72 facilitate the implementation of logic circuits built from chains of neighboring logic regions such as adders and multipliers.

Programmable logic device 70 also contains programmable memory regions 76. The circuitry in programmable logic regions 72 and programmable memory regions 76 uses programmable switch or connector components. Such programmable components may be based on random-access memory, read-only memory, erasable programmable read-only memory, electrically-erasable programmable read-only memory, fuses, antifuses, ferroelectric elements, or any other suitable programmable component technology.

Programmable memory regions 76 may be used as random-access memory, read-only memory, first-in-first out memory, and dual-port memory. Programmable memory regions 76 may also be used to implement complex logic functions for applications such as multipliers, microcontrollers, state machines, and digital signal processors.

Programmable memory regions 76 may be programmed with a read-only pattern to create a large look-up table. Such an arrangement allows programmable memory regions 76 to perform certain combinatorial functions quickly by looking up results in the look-up table, rather than by computing results using programmable logic regions 72.

Although the maximum data port size of each programmable memory region 76 is fixed, a user can effectively increase the size of the programmable memory region data ports of device 70 by using input and output resources from nearby programmable logic regions 72. For example, programmable memory region 76*a* may be connected to programmable logic region 72*a* by supplemental data input lines 78*a*, so that resources in programmable logic region 72*a* can be used to effectively increase the width of the input data port in programmable memory region 76*a*. Similarly, programmable memory region 76*a* may be connected to programmable logic region 72*b* by supplemental data output lines 78*b*, so that resources in programmable logic region 72*b* can be used to effectively increase the width of the output data port in programmable memory region 76*a*. If desired, lines such as supplemental data input lines 80*a* and supplemental data output lines 80*b* may be used to connect additional programmable logic regions 72 to programmable memory regions 76*a* to further increase the effective width of the data ports in memory region 76*a*.

Vertical interconnections 82 are used to convey signals between logic regions 72 in a column. Horizontal interconnections 84 are used to convey signals between logic regions 72 in a row. There are preferably numerous interconnections 82 and 84 in each row and column. A number of input/output pads 86 are connected to the ends of at least some of the interconnections 82 and 84 in each row and column.

There are programmable connections between programmable logic regions 72 and interconnections 82 and 84, between programmable memory regions 76 and interconnections 82 and 84, and between vertical interconnections 82 and horizontal interconnections 84 that are not shown in FIG. 4 to avoid over-complicating the drawing.

Figure 5:
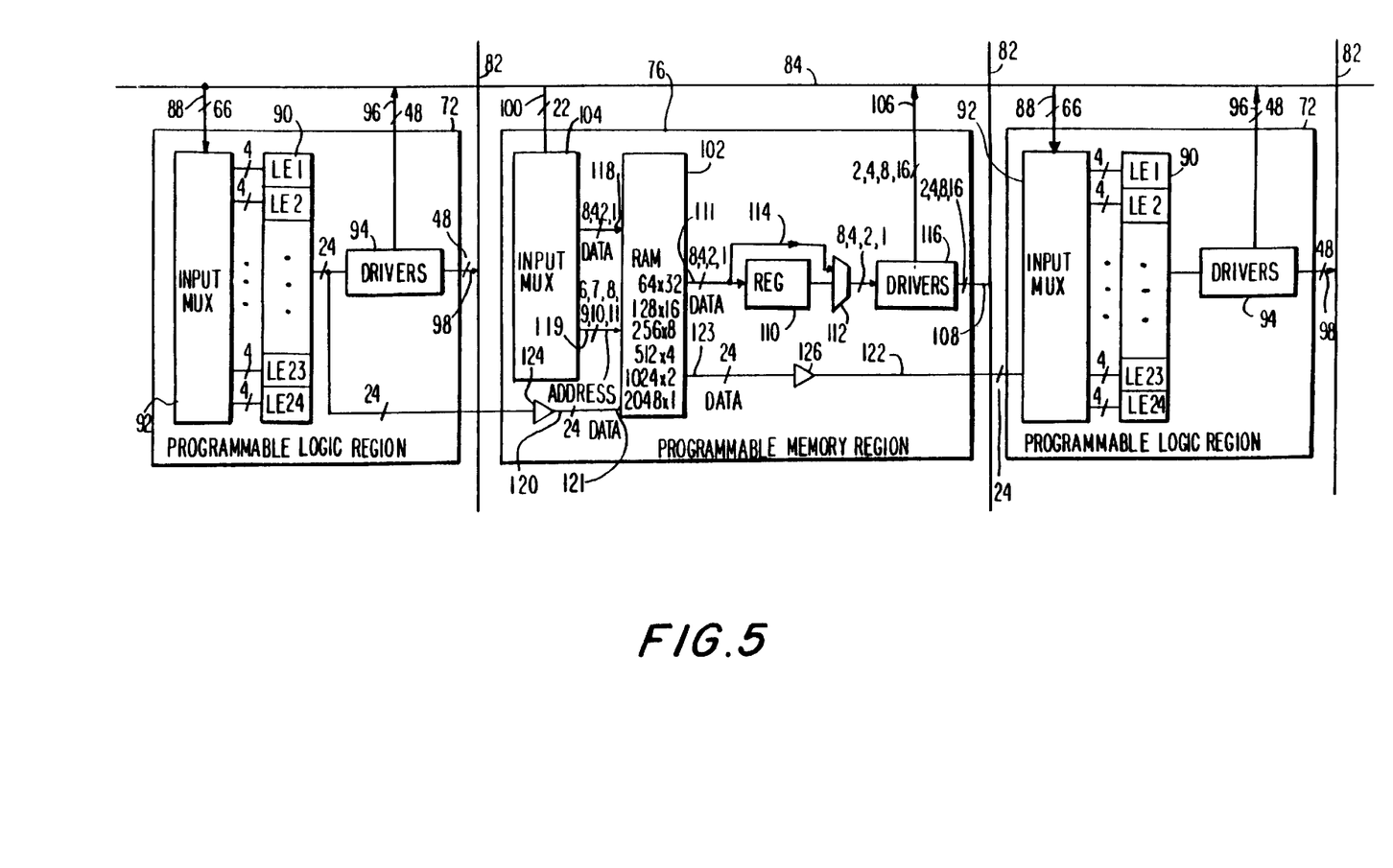
FIG. 5 is a more detailed schematic circuit diagram of a portion of the illustrative programmable logic device of FIG. 4.

Some of these programmable connections are shown in FIG. 5. For example, FIG. 5 shows how input lines 88 from horizontal interconnections 84 are programmably connected to logic elements 90 in each programmable logic region 72 by an input multiplexer 92. Output signals from logic elements 90 are routed to horizontal interconnections 84 and vertical interconnections 82 by programmable drivers 94 and output lines 96 and 98. In programmable memory region 76, input lines 100 from horizontal interconnections 84 are programmably connected to memory array 102 (which is preferably a variable depth and width random-access memory) by input multiplexer 104.

Output data at regular data output port 111 of memory array 102 is provided in up to eight-bit widths to programmable drivers 116 and output lines 106 and 108 using registers 110 and bypass multiplexer 112 or using bypass conductors 114 and bypass multiplexer 112. Input data at regular data input port 118 of memory array 102 is provided in up to eight-bit widths via input multiplexer 104.

The number of address bits used on address lines 119 varies (when memory array 102 is a variable depth and width memory array) depending on the size of the data word being used to read and write data into and out of memory array 102. For example, eleven bits of address information are used to access data in a one-bit width. Ten bits of address information are used to access data in a two-bit width. Nine bits of address information are used to access data in a four-bit word size. If eight address bits are used, data can be read into memory array 102 via regular data input port 118 and read out of memory array 102 via regular data output port 111 with an eight-bit width.

Although there may be, for example, approximately 22 possible regular input lines 100, 16 possible regular output lines 106, and 16 possible regular output lines 108 associated with programmable memory region 76, the regular data path through programmable memory region 76 is effectively limited to an eight-bit width by the size of regular input port 118 and regular output port 111. The additional regular input lines 100 and the additional regular output lines 106 and 108 are used to provide alternative pathways during device programming, thereby increasing the flexibility of the device when implementing a given logic design.

However, when a user desires to handle data widths larger than the regular data width of ports 118 and 111 (e.g. eight bits) with programmable memory region 76, supplemental data input lines 120 and supplemental data output lines 122 may be used. A user may selectively connect data inputs 88 of the left-hand programmable logic device 72 in FIG. 5 to inputs 121 memory array 102 using supplemental data input lines 120 and buffers 124. The user may also selectively connect outputs 123 of memory array 102 to data outputs 91 of logic elements 90 in the right-hand programmable logic device 72 in FIG. 5 using buffers 126 and supplemental data output lines 122. Data selection multiplexer circuitry in the input and output portions of memory array 102 may be used to route signals within memory array 102. Although buffers 124 and 126 are shown as being part of programmable memory region 76, either or both of such buffers may alternatively be provided as part of programmable logic regions 72 if desired.

Each programmable logic region 72 in FIG. 5 has 24 logic elements 90, so the effective data width handling capacity of each programmable logic region 72 is 24 bits. More than 24 possible inputs 88 and outputs 96 and 98 are provided for each programmable logic region 72, but those additional possible inputs and outputs are for providing more flexibility in routing data into and out of programmable logic region 72, not for handling continuous data streams of greater than 24 bits in width.

Because programmable logic regions 72 are capable of handling 24 bit data words, the input resources of the left-hand programmable logic region 72 in FIG. 5 may be used to increase the effective width of the input port data of programmable memory region 76 from eight bits (when only regular input data port 118 is used) to 32 bits (when both regular input data port 118 and inputs 121 are used). Similarly, the output resources of the right-hand programmable logic region 72 in FIG. 5 may be used to increase the effective width of the data output port of programmable memory region 76 from eight bits (when only regular output data port 111 is used) to 32 bits (when both regular output data port 111 and outputs 123 are used).

When handling data of normal widths, memory array 102 may be configured as: a 256×8 array (to handle eight-bit data using an eight bit address signal), as a 512×4 array (to handle four-bit data using a nine-bit address signal), as a 1024×2 array (to handle two-bit data using a ten-bit address signal), or as a 2048×1 array (to handle one-bit data using an eleven-bit address signal). When inputs 121 and outputs 123 are used, memory array 102 may be placed in two additional depth and width configurations by the user: a 128×16 configuration and a 64×32 configuration.

In the 128×16 configuration, memory array 102 handles 16 bit data using a seven bit address signal on address lines 119. Eight of the data input lines used by memory array 102 are the regular data input lines connected to regular data input port 118. The other eight data input lines that are used are eight of supplemental data input lines 120. Eight of the data output lines used by memory array 102 are the regular data output lines connected to regular data output port 111. The other eight data output lines that are used are eight of supplemental data output lines 122.

Eight bits of input data from horizontal interconnections 84 are passed to regular data input port 118 of memory array 102 by regular input lines 100 and input multiplexer 104. The other eight bits of input data from horizontal interconnections 84 are passed to inputs 121 through the left-hand programmable logic region 72 by input lines 88, input multiplexer 92, logic elements 90, buffers 124, and supplemental data input lines 120.

Eight bits of output data from memory array 102 are passed from regular data output port 111 of memory array 102 to eight of output lines 106 and 108 using register 110 or bypass conductors 114, multiplexer 112, and drivers 116. The other eight bits of output data from memory array 102 are passed from outputs 123 to eight of output lines 96 and 98 in the right-hand programmable logic region 72 using buffers 126, supplemental data output lines 122, input multiplexer 92, logic elements 90, and drivers 94.

In the 64×32 configuration, memory array 102 handles 32 bit data using a six bit address signal on address lines 119. Eight of the data input lines used by memory array 102 are the regular data input lines connected to regular data input port 118. The other 24 data input lines that are used are supplemental data input lines 120. Eight of the data output lines used by memory array 102 are the regular data output lines connected to regular data output port 111. The other 24 data output lines that are used are supplemental data output lines 122.

Eight bits of input data from horizontal interconnections 84 are passed to regular data input port 118 of memory array 102 by regular input lines 100 and input multiplexer 104. The other 24 bits of input data from horizontal interconnections 84 are passed to inputs 121 through the left-hand programmable logic region 72 by input lines 88, input multiplexer 92, logic elements 90, buffers 124, and supplemental data input lines 120.

Eight bits of output data from memory array 102 are passed from regular data output port 111 of memory array 102 to eight of output lines 106 and 108 using register 110 or bypass conductors 114, multiplexer 112, and drivers 116. The other 24 bits of output data from memory array 102 are passed from outputs 123 to 24 of output lines 96 and 98 in the right-hand programmable logic region 72 using buffers 126, supplemental data output lines 122, input multiplexer 92, logic elements 90, and drivers 94.

Figure 6:
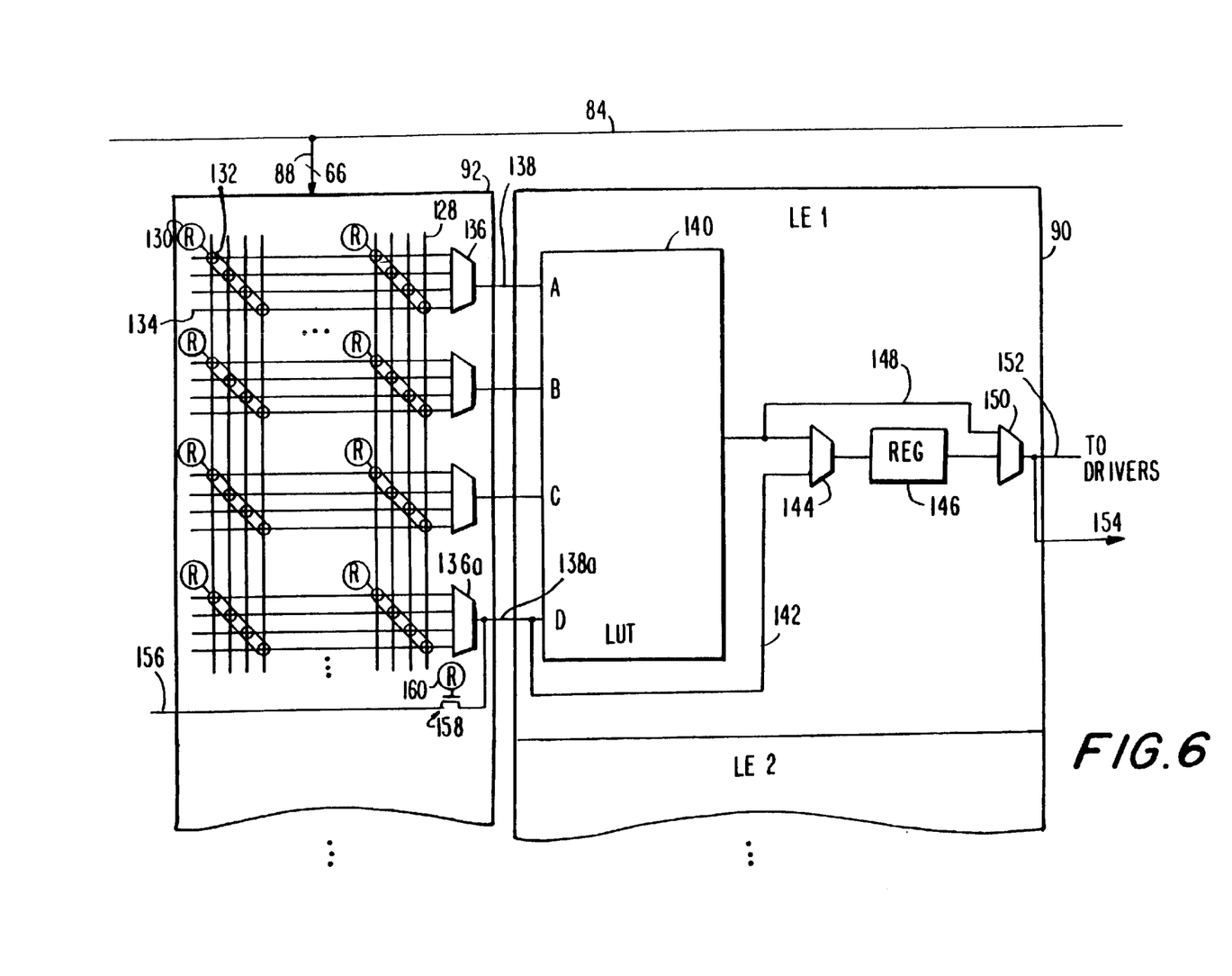
FIG. 6 is a schematic circuit diagram of a logic element and a portion of an associated input multiplexer contained within one of the logic regions of FIGS. 4 and 5 in accordance with the present invention.

An illustrative input multiplexer and logic element arrangement for a programmable logic region such as one of programmable logic regions 72 is shown in FIG. 6. Input multiplexer 92 of FIG. 6 has a number of vertical local lines 128, which are made up of input lines 88 and feedback lines from logic elements 90. When a programmable cell 130 is programmed, each of the four connections in the associated switch 132 is closed, which connects four of local lines 128 to four associated lines 134. A corresponding programmable 4:1 multiplexer 136 in that row of four lines 134 connects a selected one of the four lines 134 to a corresponding line 138. Four lines 138 are connected to respective inputs of look-up table 140. One of the inputs (e.g., the D input) of look-up table 140 preferably has an associated bypass conductor 142 and multiplexer 144, so that signals to logic element 90 that do not need to be passed through look-up table 140 can avoid incurring the delay associated with the operation of look-up table 140.

Register 146 is provided for registering output signals from multiplexer 144. Register 146 can be bypassed using bypass line 148 and multiplexer 150. Signals from logic element output 152 are provided to drivers 94 (FIG. 5).

Look-up table 140 may be bypassed using conductor 142 when programmable logic element 90 is used to provide an extra input or output for memory array 102 and a registered input or output is acceptable. Signals may be passed through look-up table 140 and bypass line 148 when an unregistered input or output is desired.

When logic element LE 1 is used to provide an additional input bit for programmable memory region 76 (i.e., when logic element LE 1 is one of the logic elements 90 in the left-hand programmable logic region 72 of FIG. 5), the data signals from multiplexer 150 are passed to programmable memory region 76 via line 154 (which is connected to buffers 124 of FIG. 5).

When logic element LE 1 is used to provide an additional output bit for programmable memory region 76 (i.e., when logic element LE 1 is one of the logic elements 90 in the right-hand programmable logic region 72 of FIG. 5), the memory array output data signals from one of the supplemental data output lines 122 (FIG. 5) are provided to line 156. Line 156 is programmably connected to line 138a by transistor 158 and memory cell 160. The data signals from line 138a may be passed to output 152 via bypass conductor 142, multiplexer 144, register 146, and multiplexer 150 or via look-up table 140, bypass line 148, and multiplexer 150.

The output signal from output 152 is provided to horizontal interconnections 84 (FIG. 5) and vertical interconnections 82 (FIG. 5) by drivers 94 (FIG. 5).

Figure 7:
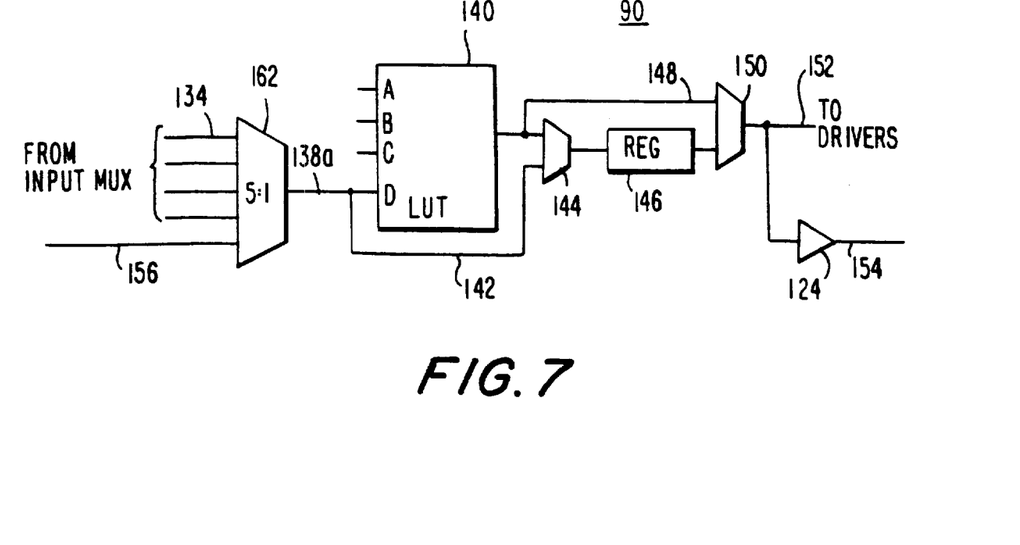
FIG. 7 is a schematic circuit diagram of the logic elements of FIG. 6 in which the input multiplexer arrangement for the D input of the look-up table has been redrawn as a 5:1 multiplexer.

The arrangement used in FIG. 6 to connect input line 156 to logic element 90 is also shown in FIG. 7. In FIG. 7, transistor 158, memory cell 160, and 4:1 multiplexer 136a of FIG. 6 have been redrawn as 5:1 multiplexer 162. In addition, FIG. 7 shows how buffers 124 may be provided as part of each logic element 90 in a programmable logic region 72, rather than as part of a programmable memory region 76 (FIG. 5).

Figure 8:
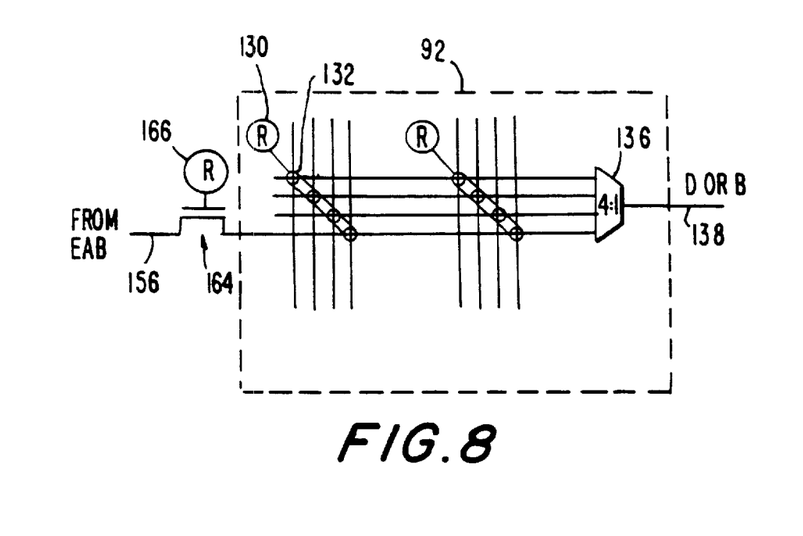
FIG. 8 is a schematic circuit diagram of an illustrative alternative input multiplexer arrangement for a logic element of a logic region in accordance with the present invention.

FIG. 8 shows an alternative arrangement for connecting input line 156 to logic element 90. In the arrangement of FIG. 8, input line 156 is connected to one of the 4:1 multiplexers 136 in input multiplexer 92 by transistor 164 and programmable cell 166. The arrangement in FIG. 7 is somewhat faster than the arrangement in FIG. 8, because signals on input line 156 in the FIG. 7 arrangement only pass through a single component (multiplexer 162), whereas signals on input line 156 in FIG. 8 pass through two components (transistor 164 and multiplexer 136). However, the arrangement in FIG. 8 may be advantageous for use with existing programmable logic region layouts.

The output signal on output line 138 in FIG. 8 (or the output signal on the output line in any other such arrangement) may be provided to any suitable input of look-up table 140, such as the B input, the D input, or any other suitable input. Depending on the type of look-up table that is used in logic element 90, the capabilities (such as bypass ability) of one type of look-up table input may be more or less desirable than the capabilities (such as flexibility) of another type of look-up table input.

Figure 9:
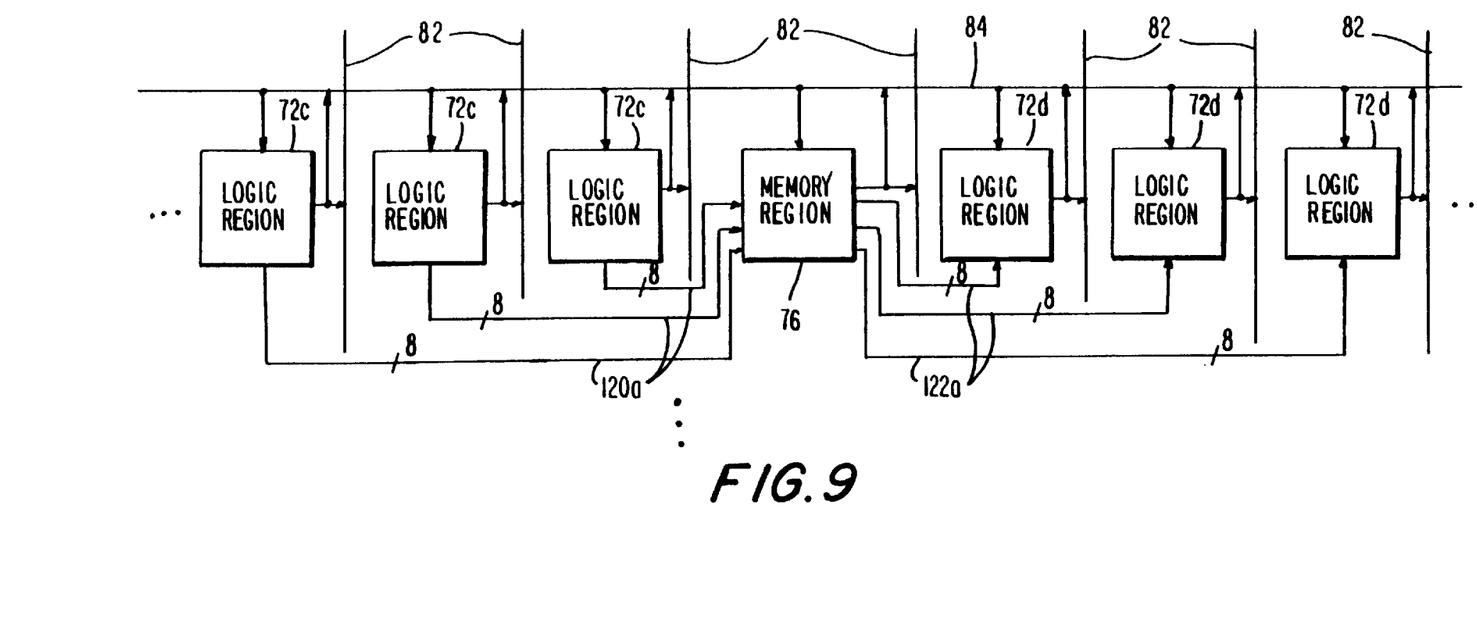
FIG. 9 is a schematic diagram of a portion of a programmable logic device in accordance with the present invention in which several logic regions to the left of a memory region are used to provide additional memory region inputs and several logic regions to the right of the memory region are used to provide additional memory region outputs.

As shown in FIG. 9, the input and output resource sharing scheme of the present invention may be implemented using multiple programmable logic regions for input resources and multiple programmable logic regions for output resources. For example, three eight-bit programmable logic regions 72c may be used to provide an eight-bit programmable memory region 76 with an additional 24 bits of input capacity using supplemental data input lines 120a. Three eight-bit programmable logic regions 72d may be used to provide the eight-bit programmable memory region 76 with an additional 24 bits of output capacity using supplemental data output lines 122a. Similar arrangements may be used for programmable memory regions 76 and programmable logic regions 72 of various other sizes.

Figure 10:
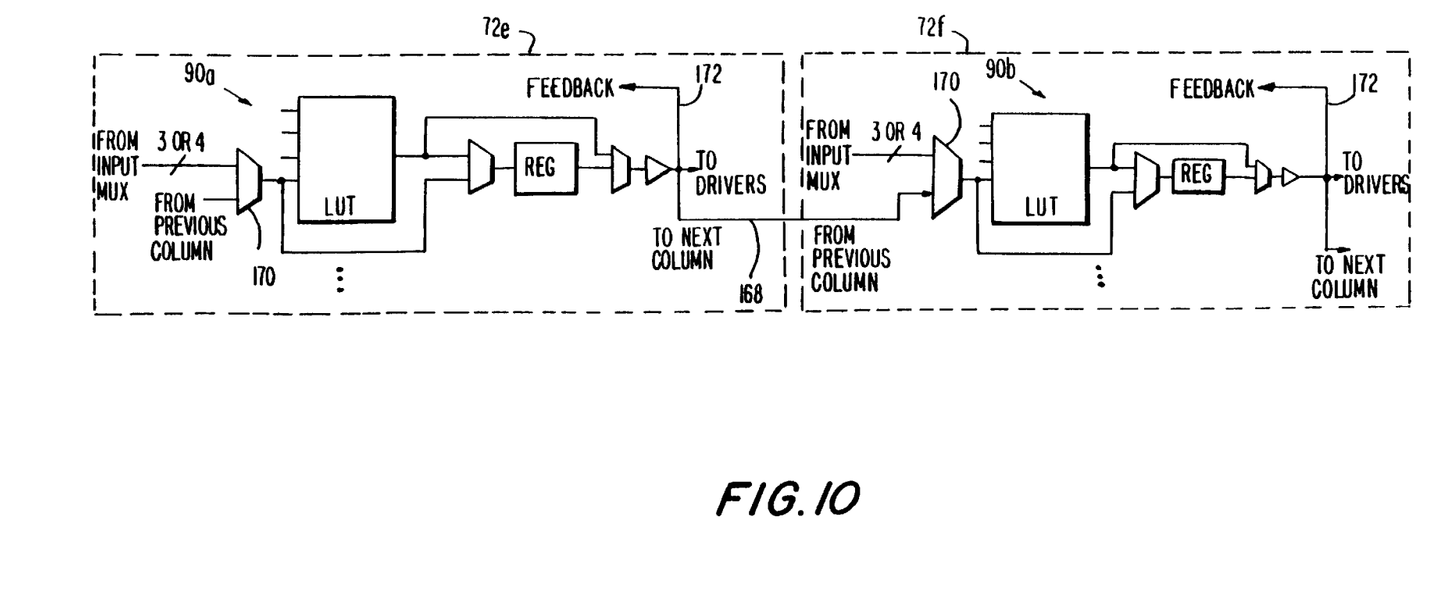
FIG. 10 is a schematic diagram of a portion of a programmable logic device in accordance with the present invention in which logic elements in successive columns are connected by direct interconnections.

If desired, direct connections may be provided between programmable logic regions 72 in adjacent columns. For example, as shown in FIG. 10, programmable logic element 90a in programmable logic region 72e may be connected to programmable logic element 90b in programmable logic region 72f in the next column via direct connection 168. Direct connections 168 may be used for any suitable functions in which it is desired to make connections between adjacent programmable logic regions 72 without using horizontal interconnections 84 and vertical interconnection 82. For example, this type of connection may be used to speed up adder trees by connecting direct connection 168 to the proper look-up table input. If desired, the look-up table input to which direct connection 168 is connected can vary from look-up table to look-up table.

Multiplexer 170 in programmable logic regions 72e and 72f may be a 4:1 multiplexer (using the arrangement of FIG. 8), a 5:1 multiplexer (using the arrangement of FIG. 7), or any other suitable multiplexer arrangement. Feedback lines 172 provide feedback to the input multiplexers (not shown) of programmable logic regions 72e and 72f.

The foregoing is merely illustrative of the principles of this invention and various modifications can be made by those skilled in the art without departing from the scope and spirit of the invention. For example, different numbers of conductors may be used for the various inputs, outputs, direct connections, and horizontal and vertical interconnections than are described above. Programmable memory regions with components of different sizes may be used. Different types of switching arrangements may be used in place of the input multiplexers. Programmable logic regions with different numbers of logic elements may be used. The logic elements in the programmable logic regions may have various configurations. Feedback connections may be provided in the logic elements. Logic elements may have carry, cascade, and other such connections to nearby logic elements.

What is claimed is:

1. A programmable logic device comprising:

a programmable memory region having a data input port of a given input width;

a programmable logic region with data inputs; and supplemental data input lines between the programmable logic region with data inputs and the programmable memory region for selectively connecting the data inputs to the programmable memory region to increase the effective width of the data input port beyond the given input width.

2. The programmable logic device defined in claim 1 wherein the programmable memory region has a data output port of a given output width, the programmable logic device further comprising:

a programmable logic region with data outputs; and supplemental data output lines between the programmable memory region and the programmable logic region with data outputs so that the programmable memory region can be selectively connected to the data outputs to increase the effective width of the data output port beyond the given output width.

3. The programmable logic device defined in claim 1 wherein the programmable memory region has a data output port with a given output width the same as the given input width, the programmable logic device further comprising:

a programmable logic region with data outputs; and supplemental data output lines between the programmable memory region and the programmable logic region with data outputs so that the programmable memory region can be selectively connected to the data outputs to increase the effective width of the data output port beyond the given output width.

4. The programmable logic device defined in claim 1 wherein the programmable memory device contains a memory array.

5. The programmable logic device defined in claim 1 wherein the programmable memory device contains a variable depth and width memory array.

6. The programmable logic device defined in claim 1 wherein the programmable memory device contains a variable depth and width random-access memory array.

7. The programmable logic device defined in claim 1 further comprising buffers connected between the programmable logic region with data inputs and the programmable memory region for buffering signals from the data inputs.

8. The programmable logic device defined in claim 1 wherein the programmable memory region has a data output port of a given output width, the programmable logic device further comprising:

a programmable logic region with data outputs;

supplemental data output lines between the programmable memory region and the programmable logic region with data outputs so that the programmable memory region can be selectively connected to the data outputs to increase the effective width of the data output port beyond the given output width; and buffers connected between the programmable memory region and the programmable logic region with data outputs for buffering signals for the data outputs.

9. The programmable logic device defined in claim 1 further comprising:

a plurality of logic elements in the programmable logic region with data inputs; and an input multiplexer in the programmable logic region with data inputs for routing signals from the data inputs to the logic elements.

10. The programmable logic device defined in claim 1 further comprising a plurality of logic elements in the programmable logic region with data inputs, each logic element containing a look-up table.

11. The programmable logic device defined in claim 1 further comprising a plurality of logic elements in the programmable logic region with data inputs, each logic element containing a look-up table and a register.

12. The programmable logic device defined in claim 1 further comprising:

an input multiplexer in the programmable logic region with data inputs; and a plurality of logic elements in the programmable logic region with data inputs, the input multiplexer routing signals from the data inputs to the logic elements, wherein a separate one of the supplemental data input lines is associated with and receives a logic element output signal from each of the logic elements.

13. The programmable logic device defined in claim 1 wherein the programmable memory region has a data output port of a given output width, the programmable logic device further comprising:

a programmable logic region with data outputs;

supplemental data output lines between the programmable memory region and the programmable logic region with data outputs so that the programmable memory region can be selectively connected to the data outputs to increase the effective width of the data output port beyond the given output width; and a plurality of logic elements in the programmable logic region with data outputs, wherein a separate one of the supplemental data output lines is associated with each of the logic elements and provides that logic element with an output data signal from the programmable memory region.

14. The programmable logic device defined in claim 1 further comprising:

at least one additional programmable logic region with data inputs; and additional supplemental data input lines between each additional programmable logic region with data inputs and the programmable memory region so that the data inputs in each programmable logic region with data inputs can be selectively connected to the programmable memory region to increase the effective width of the data input port beyond the given input width.

15. The programmable logic device defined in claim 1 wherein the programmable memory region has a data output port with a given data output width, the programmable logic device further comprising:

at least one additional programmable logic region with inputs;

a plurality of programmable logic regions with outputs;

additional supplemental data input lines between each additional programmable logic region with data inputs and the programmable memory region so that the data inputs in each programmable logic region with data inputs can be selectively connected to the programmable memory region to increase the effective width of the data input port beyond the given input width; and supplemental data output lines between the programmable memory region and each of the programmable logic regions with data outputs so that the programmable memory region can be programmably connected to the data outputs in each programmable logic region with data outputs to increase the effective width of the data output port beyond the given data output width.

16. The programmable logic device defined in claim 1 further comprising an input multiplexer for routing signals from the data inputs to the supplemental data input lines, wherein the input multiplexer comprises:

a plurality of vertical conductors connected to the data inputs of the programmable logic region;

a plurality of rows of horizontal conductors selectively connected to the vertical conductors;

a plurality of multiplexers each having inputs selectively connected to the horizontal conductors in a row and each having an output;

a plurality of look-up tables; and a plurality of bypass conductors each of which couples the output of one of the multiplexers to one of the supplemental data input lines bypassing a respective look-up table.

17. The programmable logic device defined in claim 1 wherein the programmable memory region has a data output port of a given output width, the programmable logic device further comprising:

a programmable logic region with data outputs;

supplemental data output lines between the programmable memory region and the programmable logic region with data outputs so that the programmable memory region can be selectively connected to the data outputs to increase the effective width of the data output port beyond the given output width;

a plurality of vertical conductors in the programmable logic region with data outputs that are connected to data inputs of the programmable logic region with data outputs;

a plurality of rows of horizontal conductors in the programmable logic region with data outputs that are selectively connected to the vertical conductors;

a plurality of multiplexers each having inputs selectively connected to the horizontal conductors in a row and each having an output coupled to one of the data outputs of the programmable logic region with data outputs; and circuitry associated with each multiplexer for forming a programmable connection between each of the supplemental data output lines and a respective one of the multiplexer outputs.

18. The programmable logic device defined in claim 1 wherein the programmable memory region has a data output port of a given output width, the programmable logic device further comprising:

a programmable logic region with data outputs;

supplemental data output lines between the programmable memory region and the programmable logic region with data outputs so that the programmable memory region can be selectively connected to the data outputs to increase the effective width of the data output port beyond the given output width;

a plurality of vertical conductors in the programmable logic region with data outputs that are connected to data inputs of the programmable logic region with data outputs;

a plurality of rows of horizontal conductors in the programmable logic region with data outputs that are selectively connected to the vertical conductors;

a plurality of multiplexers each having inputs selectively connected to the horizontal conductors in a row and each having an output coupled to one of the data outputs of the programmable logic region with data outputs; and a programmable connection between each of the supplemental data output line and a respective one of the horizontal conductors.

19. The programmable logic device defined in claim 1 further comprising a plurality of programmable logic regions arranged in rows and columns.

20. The programmable logic device defined in claim 1 further comprising a plurality of programmable memory regions arranged in a column.

21. The programmable logic device defined in claim 1 further comprising:

a plurality of programmable logic regions arranged in columns; and direct connections between the respective outputs and inputs of programmable logic regions in successive columns.

22. The programmable logic device defined in claim 1 wherein the programmable logic region with data inputs further comprises data outputs and wherein the programmable memory region has a data output port of a given output width, the programmable logic device further comprising:

a plurality of such programmable logic regions with data inputs and data outputs; and supplemental data output lines between the programmable memory region and one of the programmable logic regions so that the programmable memory region can be programmably connected to the data outputs of that programmable logic region to increase the effective width of the data output port beyond the given output width.

* * * * *